United States Patent
Hirashita

(10) Patent No.: US 10,369,596 B2
(45) Date of Patent: Aug. 6, 2019

(54) VIBRATOR UNIT AND TARGET SUPPLY DEVICE

(71) Applicant: Gigaphoton Inc., Tochigi (JP)

(72) Inventor: Toshiyuki Hirashita, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 15/480,398

(22) Filed: Apr. 6, 2017

(65) Prior Publication Data
US 2017/0209899 A1   Jul. 27, 2017

Related U.S. Application Data

(63) Continuation of application No. PCT/JP2014/081259, filed on Nov. 26, 2014.

(51) Int. Cl.
*H01L 41/09* (2006.01)
*B06B 1/06* (2006.01)
(Continued)

(52) U.S. Cl.
CPC ........ *B06B 1/0644* (2013.01); *B05B 17/0669* (2013.01); *B05B 17/0676* (2013.01);
(Continued)

(58) Field of Classification Search
CPC .............. B06B 1/0644; B05B 17/0669; B05B 17/0676; G03F 7/0033; H01L 21/077; H05G 2/06
(Continued)

(56) References Cited

U.S. PATENT DOCUMENTS 6,196,219 B1 * 3/2001 Hess .................. A61M 15/0085
128/200.21
6,382,765 B1 * 5/2002 Kanda .................. B41J 2/16579
347/23
(Continued)

FOREIGN PATENT DOCUMENTS

JP   S61-152086 A    7/1986
JP   3-295410 A  * 12/1991 ............. G01C 19/72
(Continued)

OTHER PUBLICATIONS

International Preliminary Report on Patentability (IPRP) dated May 30, 2017, with Written Opinion, from corresponding PCT/JP2014/081259, 7 pp.
(Continued)

*Primary Examiner* — Thomas M Dougherty
(74) *Attorney, Agent, or Firm* — Studebaker & Brackett PC

(57) ABSTRACT

A vibrator unit may be configured to vibrate a target material in a target channel and include a vibration element configured to vibrate in response to an external electrical signal having a predetermined frequency. A resonance frequency of the vibration element may be different from the predetermined frequency of the electrical signal. A vibrator unit may include a vibration transmission member in contact with the first member including the target channel in interior; and a vibration element that is in contact with the vibration transmission member. A mode-1 natural frequency of the vibration transmission member may be different from a resonance frequency of the vibration element.

21 Claims, 7 Drawing Sheets

(51) Int. Cl.
*H01L 21/027* (2006.01)
*B05B 17/06* (2006.01)
*G03F 7/20* (2006.01)
*H05G 2/00* (2006.01)

(52) U.S. Cl.
CPC ........ *G03F 7/70033* (2013.01); *H01L 21/027* (2013.01); *H05G 2/006* (2013.01)

(58) Field of Classification Search
USPC ................................. 310/315, 317, 328, 346
See application file for complete search history.

(56) References Cited

U.S. PATENT DOCUMENTS

| | | | |
|---|---|---|---|
| 6,713,943 B1* | 3/2004 | Matsuda | H02N 2/0025 |
| | | | 310/317 |
| 7,405,416 B2 | 7/2008 | Algots et al. | |
| 8,748,854 B2 | 7/2014 | Vaschenko | |
| 9,310,689 B2* | 4/2016 | Schimmel | H05G 2/003 |
| 2004/0233793 A1* | 11/2004 | Sawada | G04C 3/12 |
| | | | 368/157 |
| 2013/0206863 A1 | 8/2013 | Yabu et al. | |
| 2014/0160450 A1* | 6/2014 | Loopstra | H05G 2/005 |
| | | | 355/30 |
| 2014/0285550 A1 | 9/2014 | Kodama et al. | |

FOREIGN PATENT DOCUMENTS

| | | | | | |
|---|---|---|---|---|---|
| JP | 4-29573 | A | * | 1/1992 | ............... H02N 2/00 |
| JP | H05-226717 | A | | 9/1993 | |
| JP | 2836189 | B2 | * | 12/1998 | ............... H02N 2/00 |
| JP | 2010-182555 | A | | 8/2010 | |
| JP | 2012-216799 | A | | 11/2012 | |
| JP | 2013-168221 | A | | 8/2013 | |
| JP | 2014-529840 | A | | 11/2014 | |
| JP | 2014-529862 | A | | 11/2014 | |
| WO | 2013/020758 | A1 | | 2/2013 | |
| WO | 2013/029902 | A1 | | 3/2013 | |
| WO | 2013/131706 | A1 | | 9/2013 | |
| WO | 2014/082811 | A1 | | 6/2014 | |

OTHER PUBLICATIONS

An Office Action; "Notification of Reasons for Refusal," issued by the Japanese Patent Office on Jul. 3, 2018, which corresponds to Japanese Patent Application No. 2016-561143 and is related to U.S. Appl. No. 15/480,398; with English Translation.
International Search Report issued in PCT/JP2014/081259; dated Mar. 10, 2015.

* cited by examiner

VIBRATOR UNIT AND TARGET SUPPLY DEVICE

CROSS-REFERENCE TO RELATED APPLICATIONS

The present application is a continuation application of International Application No. PCT/JP2014/081259 filed on Nov. 26, 2014. The content of the application is incorporated herein by reference in its entirety.

BACKGROUND

1. Technical Field

The present disclosure relates to a vibrator unit and a target supply device.

2. Related Art

In recent years, as semiconductor processes have moved to finer design rules, transfer patterns for photolithography in semiconductor processes have been rapidly shifted to finer designs. In the next generation, fine patterning of 70 nm-45 nm or fine patterning of 32 nm or less will be required. To meet the requirement for fine patterning of 32 nm or less, for example, the development of an exposure device has been expected which is a device for generating extreme ultraviolet (EUV) light of a wavelength of about 13 nm combined with reduced projection reflective optics.

The following three devices have been proposed as EUV light generating devices: laser produced plasma (LPP) devices which use plasma generated by irradiation of target substances with laser light, discharge produced plasma (DPP) devices which use plasma generated by discharge, and synchrotron radiation (SR) devices which use synchrotron orbital radiation.

CITATION LIST

Patent Literature

Patent Literature 1: Japanese Patent Application Laid-Open No. 2010-182555
Patent Literature 2: Japanese Patent Application Laid-Open No. 2013-168221
Patent Literature 3: Japanese Patent Application Laid-Open No. 2012-216799
Patent Literature 4: U.S. Pat. No. 7,405,416
Patent Literature 5: U.S. Pat. No. 8,748,854
Patent Literature 6: International Publication No. WO 2013/131706
Patent Literature 7: International Publication No. WO 2014/082811

SUMMARY

A vibrator unit according to one embodiment of the present disclosure may be a vibrator unit (310, 320, 330) configured to vibrate a target material (271) in a target channel (FL) and including: a vibration element (314). The vibration element (314) may be configured to vibrate in response to an external electrical signal having a predetermined frequency. A resonance frequency of the vibration element may be different from the predetermined frequency of the electrical signal.

A vibrator unit according to another embodiment of the present disclosure may be a vibrator unit (310, 320, 330) configured to vibrate a target material (271) in a target channel (FL) and including: a vibration transmission member (311, 331); and a vibration element (314). The vibration transmission member (311, 331) may be in contact with a first member (265, 260) including the target channel in the interior. The vibration element (314) may be in contact with the vibration transmission member and vibrate in response to an external electrical signal having a predetermined frequency. A mode-1 natural frequency of the vibration transmission member may be different from the resonance frequency of the vibration element.

A target supply device according to another embodiment of the present disclosure may be a target supply device that ejects a target material (271) and includes: a first member (265, 260); and a vibrator unit (310, 320, 330). The first member (265, 260) may include a target channel (FL) in the interior. The vibrator unit (310, 320, 330) may include a vibration element (314). The vibration element (314) may be configured to vibrate in response to an external electrical signal having a predetermined frequency. A resonance frequency of the vibration element may be different from the predetermined frequency of the electrical signal.

A target supply device according to another embodiment of the present disclosure may be a target supply device that ejects a target material (271) and includes: a first member (265, 260); a vibration element (314). The first member (265, 260) may include a target channel (FL) in the interior. The vibrator unit (310, 320, 330) may include: a vibration transmission member (311, 331), and a vibration element (314), The vibration transmission member (311, 331) may include the target channel in the interior and in contact with the first member (265, 260). The vibration element (314) may configured to be in contact with the vibration transmission member and vibrate in response to an external electrical signal having a predetermined frequency. A mode-1 natural frequency of the vibration transmission member may be different from a resonance frequency of the vibration element.

An extreme UV light generation system according to another embodiment of the present disclosure may include: a chamber (2); the target supply device; a laser apparatus (3); and a collector mirror (23). The target supply device may be configured to supply the target substance to the chamber. The laser apparatus (3) may be configured to irradiate the target substance in the chamber with laser light. The collector mirror (23) may be configured to collect extreme ultraviolet light from the plasma of the target substance generated by the irradiation with the laser light.

BRIEF DESCRIPTION OF THE DRAWINGS

Embodiments of the present disclosure will now be described as illustrative only with reference to the attached drawings.

EMBODIMENTS

Figure 1:
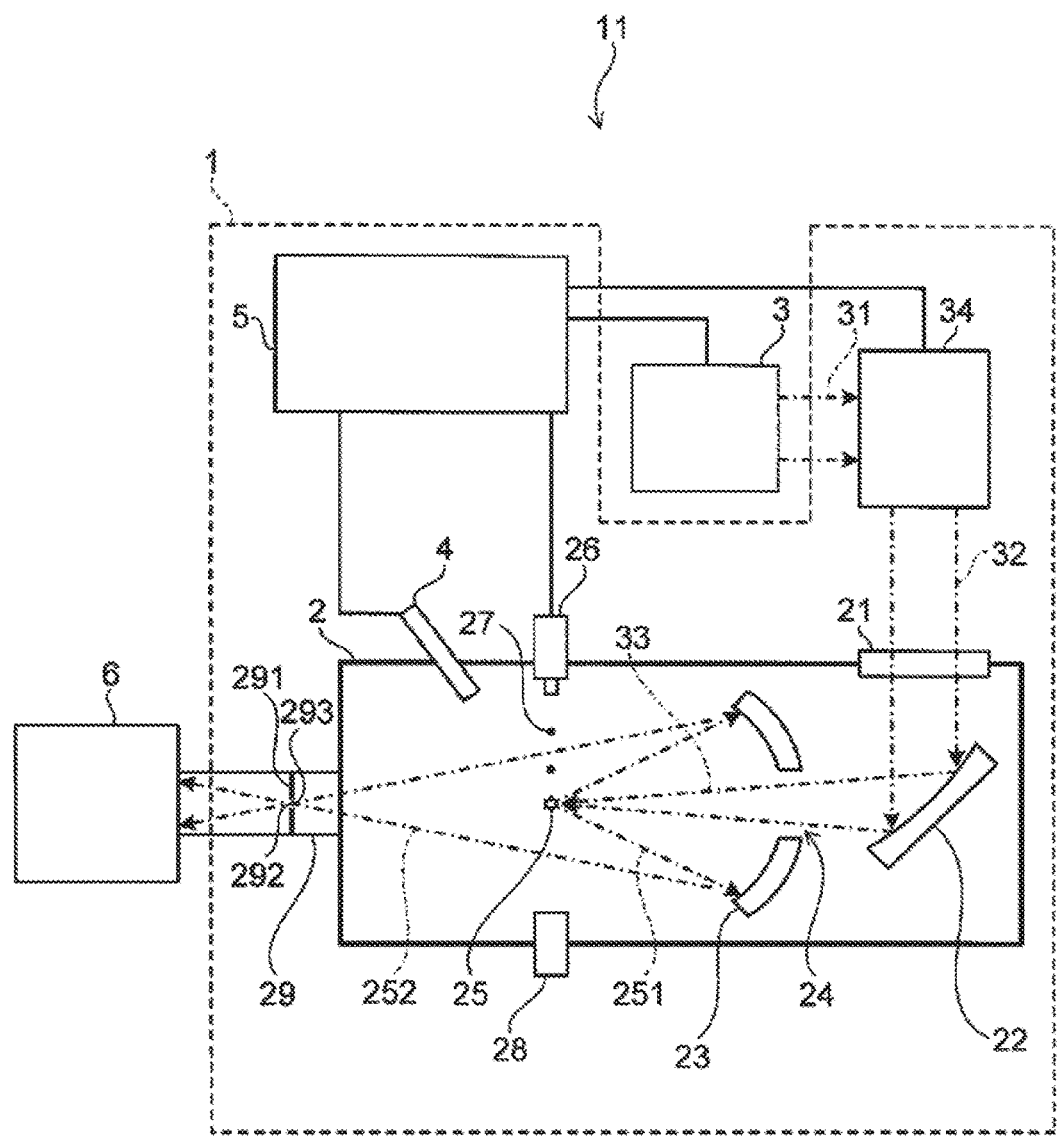
FIG. 1 schematically illustrates the configuration of an illustrative LPP EUV light generation system.

Contents
1. Overview
2. General description of extreme ultraviolet light generating device
   2.1 Configuration
   2.2 Operation
3. Terms
4. Target supply device including vibrator unit
   4.1 Configuration
   4.2 Operation
5. Vibrator unit: Comparative example
   5.1 Configuration
   5.2 Operation
   5.3 Effect
   5.4 Problem to be Solved
6. Vibrator unit: Embodiment 1
   6.1 Configuration
   6.2 Operation
   6.3 Description of shape of vibration transmission member
   6.4 Effect
7. Vibrator unit: Embodiment 2
   7.1 Configuration
   7.2 Operation
   7.3 Effect
8. Vibrator unit: Embodiment 3
   8.1 Configuration
   8.2 Effect Embodiments of the present disclosure will now be described in detail with reference to the drawings. The embodiments below are to be taken as merely examples of the present disclosure and do not limit the scope of the present disclosure. In addition, not all the configurations and the operations described in the embodiments are necessarily essential to the configurations and the operations of the present disclosure. It should be noted that the same components are denoted by the same reference numeral and overlaps between their descriptions will be omitted.

1. OVERVIEW

An embodiment of the present disclosure may relate to a vibrator unit for use in a target supply device for supplying droplets of a target material for EUV light generation, and a target supply device and an EUV light generating device including the same. More specifically, an embodiment of the present disclosure may relate to a vibrator unit that applies vibration to a nozzle tip to transform a target material jetted from the nozzle into droplets, and a target supply device and an EUV light generating device including the same. Note that the present disclosure should not be limited to these factors and may relate to any factors for transforming a jetted liquid into droplets.

2. GENERAL DESCRIPTION OF EUV LIGHT GENERATION SYSTEM 2.1 Configuration

FIG. 1 schematically illustrates the configuration of an illustrative LPP EUV light generation system. An EUV light generating device 1 may be used with at least one laser apparatus 3. In this application, a system including the EUV light generating device 1 and the laser apparatus 3 is referred to as an EUV light generation system 11. As illustrated in FIG. 1 and described later in detail, the EUV light generating device 1 may include a chamber 2 and a target supply unit 26. The chamber 2 may be a hermetically sealable. The target supply unit 26 may be mounted, for example, passing through the wall of the chamber 2. A target substance material supplied from the target supply unit 26 may be tin, terbium, gadolinium, lithium, xenon, or any combination of two or more of them; however, this is not necessarily the case.

The wall of the chamber 2 may have at least one through hole. The through hole may be provided with a window 21 and pulse laser light 32 from the laser apparatus 3 may pass through the window 21. The chamber 2 may contain an EUV condenser mirror 23 (collector mirror) having a spheroidal reflective surface. The EUV condenser mirror 23 may have first and second focuses. For example, a multi-layer reflective film with alternating molybdenum and silicon layers may be formed on the surface of the EUV condenser mirror 23. For example, the first focus of the EUV condenser mirror 23 is preferably located in a plasma generated region 25 and its second focus is preferably located at an intermediate light collection point (IF) 292. A through hole 24 may be provided in the center of the EUV condenser mirror 23 and pulse laser light 33 may pass through the through hole 24.

The EUV light generating device 1 may include an EUV light generation controller 5, a target sensor 4, and other components. The target sensor 4 may have an imaging function and be configured to detect the presence, path, position, speed, and other information of the target 27.

The EUV light generating device 1 may further include a connecting portion 29 that establishes communication between the interior of the chamber 2 and the interior of a stepper 6. The connecting portion 29 may have a wall 291 with an aperture 293 in the interior. The wall 291 may be disposed so that its aperture 293 can be in the position of the second focus of the EUV condenser mirror 23.

The EUV light generating device 1 may further include a laser light travel direction controlling unit 34, a laser light condenser mirror 22, a target recovery unit 28 for recovery of the target 27, and other components. The laser light travel direction controlling unit 34 may include an optical element for defining the travel direction of the laser light, and an actuator for adjusting the position, the posture and the like of the optical element.

2.2 Operation

As illustrated in FIG. 1, pulse laser light 31 from the laser apparatus 3 may pass through the laser light travel direction controlling unit 34 and then enter the interior of the chamber 2 through the window 21 as the pulse laser light 32. The pulse laser light 32 may travel to an inside of the chamber 2 along at least one laser light path, be reflected by the laser light condenser mirror 22, and be radiated to at least one target 27 as pulse laser light 33.

The target supply unit 26 may be configured to output the target 27 to the plasma generated region 25 in the chamber 2. The target 27 may be irradiated with at least one pulse of the pulse laser light 33. The target 27 irradiated with the pulse laser light becomes plasma which can generate emitted light 251. EUV light 252 contained in the emitted light 251 may be selectively reflected off the EUV condenser mirror 23. The EUV light 252 reflected off the EUV condenser mirror 23 may be collected at the intermediate light collection point 292 and then fed to the stepper 6. It should be noted that a single target 27 may be irradiated with more than one pulses of pulse laser light 33.

The EUV light generation controller 5 may be configured to control the entire EUV light generation system 11. The EUV light generation controller 5 may be configured to process image data or the like of the target 27 captured by the target sensor 4. Further, the EUV light generation controller 5 may be configured to control the timing, direction and the like of the ejection of the target 27, for example. Moreover, the EUV light generation controller 5 may be configured to control the timing of lasing by the laser apparatus 3, the travel direction of the pulse laser light 32, and the position where the pulse laser light 33 is collected, for example. These different controls are illustrative only and other controls may be optionally added.

3. TERMS

The terms used in the present disclosure are defined as follows.

A "droplet" may be a drop of a molten target material. The shape of a droplet may be generally spherical.

A "plasma generated region" may be a three-dimensional space predetermined as a space where plasma is generated.

4. TARGET SUPPLY DEVICE INCLUDING VIBRATOR UNIT

An example of a target supply device including the target supply unit 26 illustrated in FIG. 1 will now be described in detail referring to the drawings.

4.1 Configuration

Figure 2:
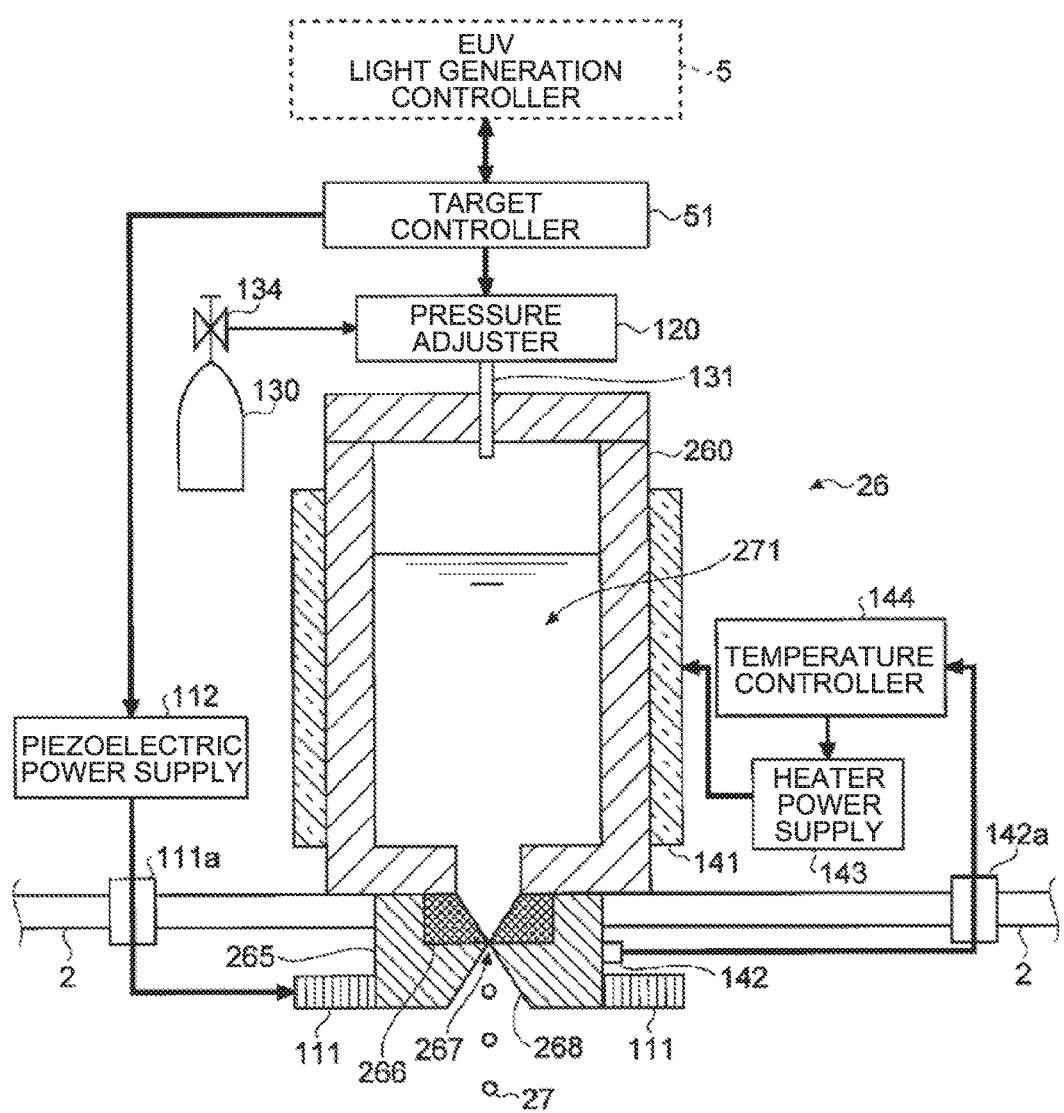
FIG. 2 is a schematic view of an example of the target supply device including the target supply unit illustrated in FIG. 1.
Figure 3:
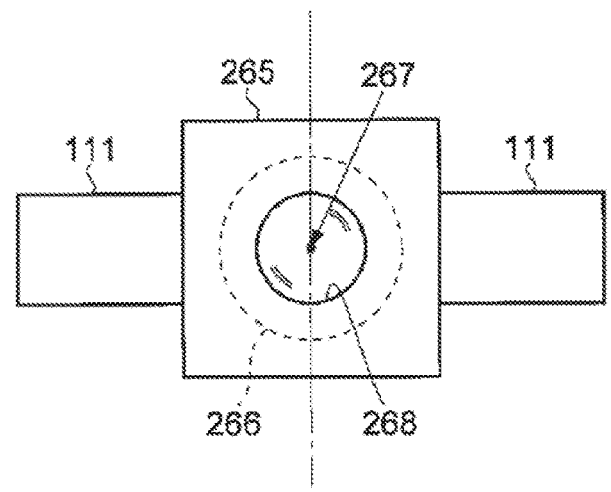
FIG. 3 is a diagram illustrating a schematic configuration of a nozzle member, a nozzle holder, and the vibrator unit illustrated in FIG. 2, viewed from below.

FIG. 2 is a schematic view of an example of the target supply device including the target supply unit illustrated in FIG. 1. FIG. 3 is a diagram illustrating a schematic configuration of a nozzle member, a nozzle holder, and a vibrator unit illustrated in FIG. 2, viewed from a direction toward which the target is ejected.

As illustrated in FIG. 2, the target supply device may include a tank 260, a nozzle member 266, a pressure adjuster 120, a temperature controller 144, a target controller 51, a vibrator unit 111, and a piezoelectric power supply 112.

The tank 260 may store tin (Sn) serving as the target material 271. The tank 260 may be composed of a material having low reactivity with tin. This material having low reactivity with tin may be molybdenum (Mo), for example.

The nozzle member 266 may have a nozzle hole 267 having a diameter within a range of 3 to 6 μm. The nozzle member 266 may be composed of a material having low reactivity with tin (e.g., Mo). The nozzle member 266 may be fixed to the bottom of the tank 260 with the use of the nozzle holder 265. The nozzle holder 265 may be composed of a material having low reactivity with tin (e.g., Mo). A flat seal may be provided between the nozzle member 266 and the nozzle holder 265, and between the tank 260 and the nozzle member 266.

The pressure adjuster 120 may be connected to an inert gas cylinder 130. A valve 134 controllable by the pressure adjuster 120 may be provided in the gas piping between the cylinder 130 and the pressure adjuster 120. The pressure adjuster 120 may be in communication with the interior of the tank 260 via an introduction pipe 131. The pressure adjuster 120 may introduce the inert gas from the cylinder 130 to the tank 260 via the introduction pipe 131.

The temperature controller 144 may be connected to a temperature sensor 142 and a heater power supply 143. The temperature sensor 142 may be disposed to measure the temperature of the tank 260 or the nozzle holder 265. The heater power supply 143 may be connected to a heater 141. The heater power supply 143 may supply current to the heater 141 in accordance with the control by the temperature controller 144. The heater 141 may be disposed to heat the target material 271 in the tank 260. For example, the heater 141 may be disposed on the outer surface of the tank 260.

The temperature sensor 142 and the temperature controller 144 may be electrically connected to each other via an introduction terminal 142a on the division wall in the chamber 2. The introduction terminal 142a may electrically insulate a line, which connects the temperature sensor 142 and the temperature controller 144 to each other, from the chamber 2 while keeping the hermeticity of the chamber 2.

The piezoelectric power supply 112 may be connected to the target controller 51 and the vibrator unit 111. The piezoelectric power supply 112 and the vibrator unit 111 may also be electrically connected to each other via an introduction terminal 111a on the division wall in the chamber 2. The introduction terminal 111a may electrically insulate a line, which connects the piezoelectric power supply 112 and the vibrator unit 111 to each other, from the chamber 2 while keeping the hermeticity of the chamber 2.

As illustrated in FIGS. 2 and 3, the vibrator unit 111 may be provided on a side surface of the nozzle holder 265. When more than one vibrator units 111 are disposed, the vibrator units 111 may be disposed axisymmetric with respect to an axis passing the center of the nozzle hole 267. The details of each vibrator unit 111 will be described later.

As illustrated in FIG. 2, the target controller 51 may be connected to the vibrator unit 111, the temperature controller 144, the pressure adjuster 120, and the EUV light generation controller 5.

The interior of the tank 260 may be in communication with the nozzle hole 267 via the target channel provided on the bottom of the tank 260. The target channel may be provided with a filter (not illustrated) for filtering the target material 271 flowing therethrough.

4.2 Operation

The target controller 51 illustrated in FIG. 2 may conduct the following process upon reception of a droplet ejection preparation signal from the EUV light generation controller 5 or a controlling unit in an external device.

In other words, the target controller 51 may first control the temperature controller 144 to set the target material 271 in the tank 260 to a temperature of its melting point or higher. Meanwhile, the temperature controller 144 may actuate the heater power supply 143 so that values detected by the temperature sensor 142 can be a predetermined temperature or higher. The predetermined temperature may be the temperature of the melting point of tin (the temperature of 232° C.) or higher when the target material 271 is tin (Sn), for example. In addition, the predetermined temperature may be a range of temperature. The range of temperature may be from 240 to 290° C., for example.

The target controller 51 may then determine if the values detected by the temperature sensor 142 are maintained for a predetermined time at a predetermined temperature or higher. If the detected value is maintained at a predetermined temperature or higher for a predetermined time, the target controller 51 may provide the EUV light generation controller 5 or the controlling unit in the external device with a notification that droplets (target 27) are ready to be ejected. Afterwards, the target controller 51 may be on standby until reception of a droplet ejection signal that requires the ejection of droplets.

Subsequently, upon reception of the droplet ejection signal, the target controller 51 may control the pressure adjuster 120 to increase the pressure in the tank 260 to a predetermined pressure. The predetermined pressure may be, for example, about 10 MPa. In addition, the target controller 51 may control the pressure adjuster 120 to keep the pressure in the tank 260 at the predetermined pressure. While the pressure in the tank 260 is kept at the predetermined pressure, the target material 271 may be jetted out of the nozzle hole 267.

The target controller 51 may then control the piezoelectric power supply 112 such that the target material 271 jetted out of the nozzle hole 267 changes into droplets in a predetermined size and a predetermined cycle. Thus, the piezoelectric power supply 112 may supply an electrical signal in a predetermined waveform to the vibrator unit 111. Vibrations generated in the vibrator unit 111 receiving the electrical signal in the predetermined waveform may be transferred to the target material 271 via the nozzle holder 265, the nozzle member 266, and the tank 260. Consequently, the jetted target material 271 may be cut into droplets in the predetermined size and the predetermined cycle.

5. VIBRATOR UNIT: COMPARATIVE EXAMPLE

An example of the vibrator unit 111 illustrated in FIGS. 2 and 3 will now be described in detail referring to the drawings.

5.1 Configuration

Figure 4:
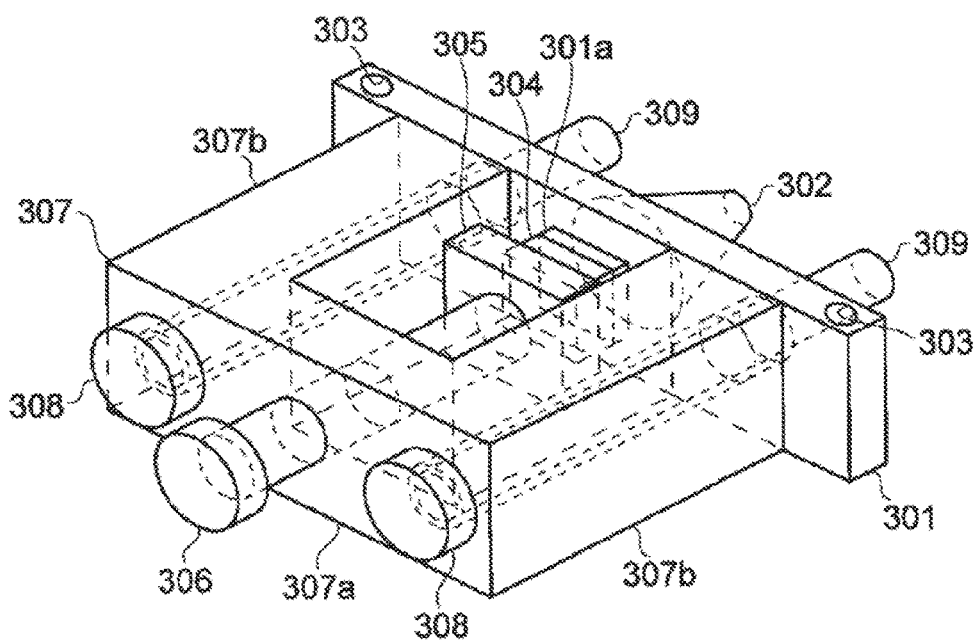
FIG. 4 is a perspective view of an example of the vibrator unit illustrated in FIG. 2.
Figure 5:
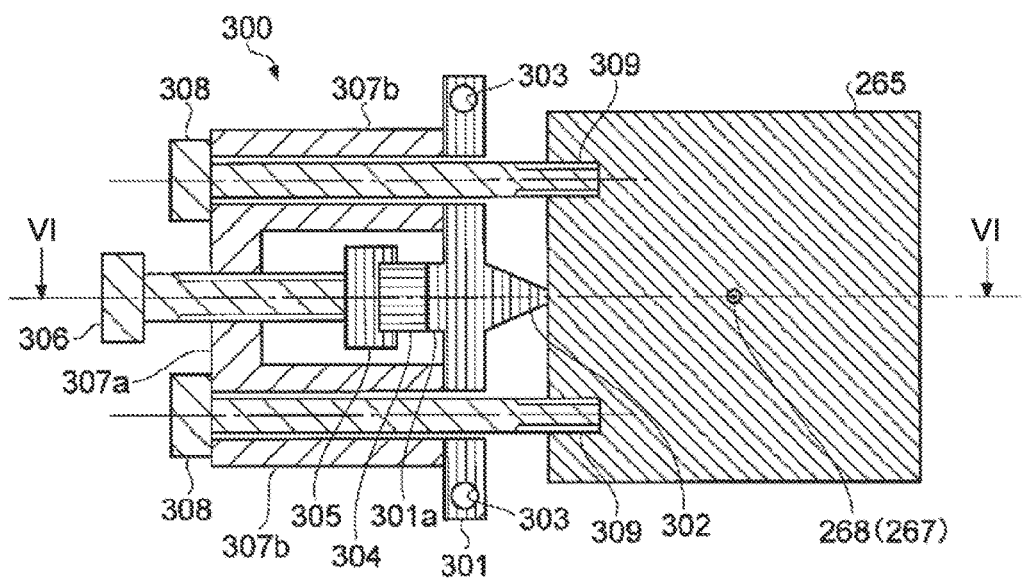
FIG. 5 is a horizontal cross-sectional view of the vibrator unit illustrated in FIG. 4.
Figure 6:
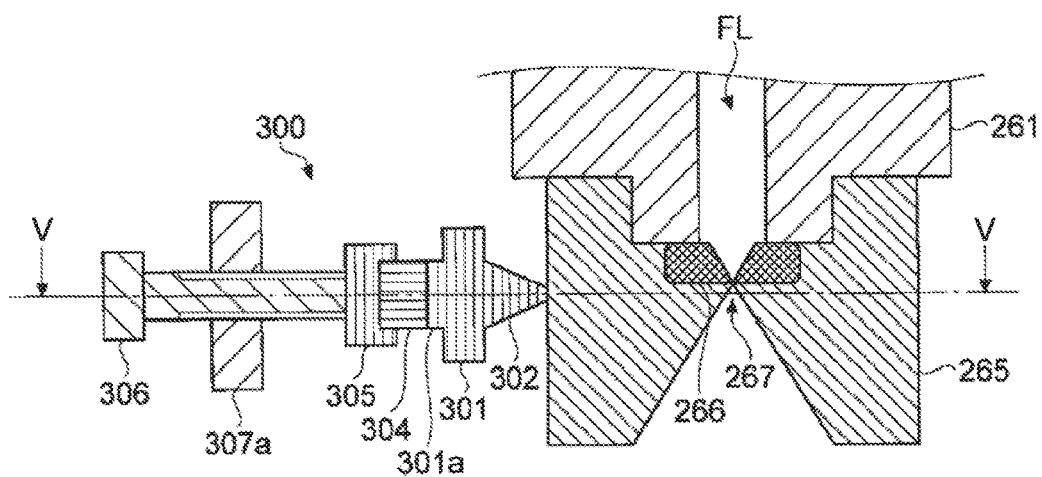
FIG. 6 is a vertical cross-sectional view of the vibrator unit illustrated in FIG. 4.

FIG. 4 is a perspective view of an example of the vibrator unit illustrated in FIG. 2. FIG. 5 is a cross-sectional view of the vibrator unit illustrated in FIG. 4 and illustrates a face along the central axes of two first bolts 308. FIG. 6 is a cross-sectional view of the vibrator unit illustrated in FIG. 4 and is perpendicular to the cross section in FIG. 5 and illustrates a face along the central axis of a second bolt 306. It should be noted that FIG. 5 illustrates an example of the cross section along line V-V in FIG. 6, and FIG. 6 illustrates an example of the cross section along line VI-VI in FIG. 5.

A vibrator unit 300 illustrated in FIGS. 4 to 6 may include the two first bolts 308, the second bolt 306, a pressure frame 307, a retention member 305, a piezoelectric element 304, and a vibration transmission member 301.

The pressure frame 307 may be a frame member for the vibrator unit 300. The pressure frame 307 may include a central beam 307a serving as a joint between one arm 307b and the other arm 307b on both sides.

The vibration transmission member 301 may be disposed between the pressure frame 307 and the nozzle holder 265. A tapered cone-like projection 302 may be provided in the center of the vibration transmission member 301. The tip of the projection 302 may be in contact with the side surface of the nozzle holder 265. The area of a contact between the tip of the projection 302 and the side surface of the nozzle holder 265 may be smaller than the area of the surface of any one of the piezoelectric elements 304.

The two first bolts 308 may fix the pressure frame 307 and the vibration transmission member 301 to the side surface of the nozzle holder 265. The end portion 309 of the shaft of each first bolt 308 may therefore be threaded. The side surface of the nozzle holder 265 may have two screw holes into which the end portions 309 of the shafts of the two first bolts 308 are screwed. The two arms 307b of the pressure frame 307 and the vibration transmission member 301 may be provided with two through holes into which the two first bolts 308 are inserted.

The second bolt 306 may push the piezoelectric element 304 and the vibration transmission member 301 against the nozzle holder 265. The beam 307a in the center of the pressure frame 307 may have a screw hole into which the second bolt 306 is screwed.

The vibration transmission member 301 may be urged toward the nozzle holder 265 side by the second bolt 306 screwed into the pressure frame 307. The piezoelectric element 304 and the retention member 305 may be disposed between the second bolt 306 and the vibration transmission member 301. The second bolt 306 may push the piezoelectric element 304 against the vibration transmission member 301 via the retention member 305 and push the projection 302 of the vibration transmission member 301 against the nozzle holder 265.

A portion of the vibration transmission member 301 which is in contact with the piezoelectric element 304 may have a mounting portion 301a in which at least a portion in contact with the piezoelectric element 304 projects. The shape of the mounting portion 301a may substantially fit the piezoelectric element 304 at the contact portion. Meanwhile, the retention member 305 that pushes the piezoelectric element 304 against the mounting portion 301a may have a receiving shape that fits the piezoelectric element 304.

The piezoelectric element 304 may be a vibration element that vibrates in response to external electrical signals. The piezoelectric element 304 may be composed of lead zirconate titanate. The piezoelectric element 304 may be a multi-layer piezoelectric element. The piezoelectric element 304 may be connected to the piezoelectric power supply 112 (see FIG. 2) by wiring (not illustrated).

The vibration transmission member 301 may be provided with cooling water piping 303. The cooling water piping 303 may be connected to a cooling water temperature adjuster (not illustrated).

It should be noted that the position in which the vibrator unit 300 is mounted is not limited to the side surface of the nozzle holder 265. For example, the vibrator unit 300 may be mounted on the side surface of the tank 260. That is, the vibrator unit 300 may be mounted in any position where it can apply vibration to the target material 271 present in the target channel FL extending from the interior of the tank 260 to the nozzle hole 267.

5.2 Operation

In the vibrator unit 300 illustrated in FIGS. 4 to 6, the second bolt 306 may apply pressure pushing the projection 302 of the vibration transmission member 301 against the nozzle holder 265, and pressure pinching the piezoelectric element 304 with the retention member 305 and the vibration transmission member 301 (pressure on the piezoelectric element 304).

To be specific, each first bolt 308 in the through hole in the arm 307b of the pressure frame 307 and the through hole in the vibration transmission member 301 may be screwed in the screw hole in the nozzle holder 265 so that pressure pushing the vibration transmission member 301 against the nozzle holder 265 may be applied to the both sides of the vibration transmission member 301.

In addition, the second bolt 306 may be screwed in the beam 307a of the pressure frame 307 so that pressure pushing the projection 302 against the nozzle holder 265 may be applied to the central portion of the vibration transmission member 301 via the retention member 305 and the piezoelectric element 304. In the same manner, pressure pinching the piezoelectric element 304 with the retention member 305 and the vibration transmission member 301 may be applied. It should be noted that pressure given by the second bolt 306 may push the projection 302 of the vibration transmission member 301 against the nozzle holder 265.

These pressures can be adjusted by adjusting the screw torque of the first bolts 308 and the second boll 306. Here, the screw torque of the first bolts 308 and the second bolt 306 may be adjusted so that vibration generated in the piezoelectric element 304 can reach the target material 271 in the tank 260 via the projection 302 of the vibration transmission member 301.

The piezoelectric element 304 may generate vibration by expanding and contracting based on electrical signals with predetermined waveforms sent from the piezoelectric power supply 112. The generated vibration may be transferred to the target material 271 in the target channel FL via the projection 302 of the vibration transmission member 301, the nozzle holder 265, the nozzle member 266, the tank 260, and other components. Thus, the target material 271 jetted out of the nozzle hole 267 can change into droplets in a predetermined size and a predetermined cycle.

The vibration transmission member 301 may be cooled by cooling water flowing through the cooling water piping 303. This may reduce the risk that the temperature of the piezoelectric element 304 increases to the Curie point or higher due to heat propagating from the heater 141 via the tank 260, the nozzle holder 265, and other components. It should be noted that the Curie point of the piezoelectric element 304 may be in a range of 150 to 350° C.

5.3 Problem to be Solved

Here, to reduce debris from the target material 271 generated in the chamber 2 in the EUV light generating device 1, the volume of the droplets of the ejected target 27 should be reduced. To eject fine droplets, the diameter of the nozzle hole 267 (hereinafter referred to as nozzle diameter) should be reduced.

However, a reduction in nozzle diameter may destabilize the cycle of droplet generation, for example. This may be because a reduction in nozzle diameter increases the frequency of vibration to be transferred to the target material 271 for stable droplet generation.

For instance, if a vibration frequency required for stable droplet generation with a nozzle diameter of Φ10 μm is 1.5 MHz, a vibration frequency required with a nozzle diameter of Φ6 μm may be 3 MHz.

A typical piezoelectric element receiving an electrical signal with a frequency higher than or equal to its resonance frequency may go into a complex vibration mode. In this vibration mode, a vibration mode out of the target frequency may become vibration noise. For instance, if a multilayer piezoelectric element having a resonance frequency of several hundred kilohertz receives a 3-MHz electrical signal, the vibration frequency of the multilayer piezoelectric element may exceed its resonance frequency. This may result in much vibration noise.

The generated vibration noise may be amplified by components in the vibration transfer path.

The generated and amplified vibration noise may destabilize the droplet generation cycle. For this reason, the embodiments below illustrate vibrator units that can reduce vibration noise.

6. VIBRATOR UNIT: EMBODIMENT 1

A vibrator unit according to Embodiment 1 will now be described in detail referring to the drawings.

6.1 Configuration

Figure 7:
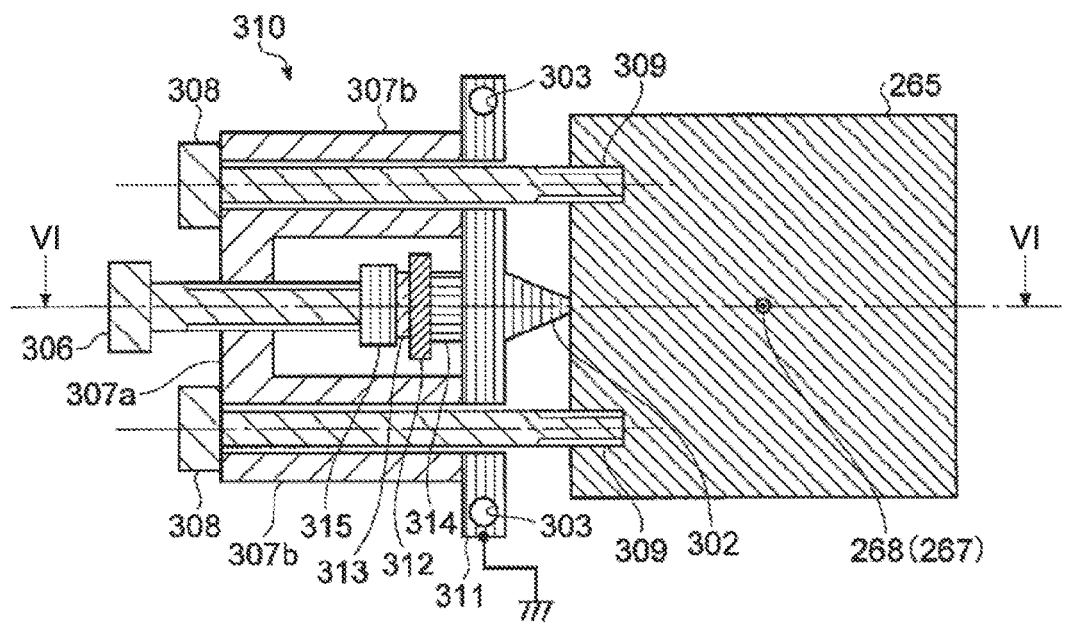
FIG. 7 is a horizontal cross-sectional view of an example of the schematic configuration of the vibrator unit according to Embodiment 1.

FIG. 7 is a cross-sectional view of an example of the schematic configuration of the vibrator unit according to Embodiment 1. It should be noted that FIG. 7 illustrates an example cross-sectional configuration corresponding to FIG. 5. In the description below, the same components as in the vibrator unit 300 are denoted by the same reference numerals as those in the vibrator unit 300 and the overlapping description will be omitted.

As illustrated in FIG. 7, a vibrator unit 310 according to Embodiment 1 may have the same configuration as the vibrator unit 300 except that it includes a piezoelectric element 314, a vibration transmission member 311, and a retention member 315 instead of the piezoelectric element 304, the vibration transmission member 301, and the retention member 305. The vibrator unit 310 may further include an electrode 312 and an insulating member 313.

The piezoelectric element 314 may be a composite piezoelectric element. The composite piezoelectric element may be a piezoelectric element composed of accumulated fine bulk piezoelectric pieces encased in resin. The resonance frequency of the piezoelectric element 314 may be, for example, 4 MHz or higher. A bulk piezoelectric element may be used as the piezoelectric element 314 instead of a composite piezoelectric element.

The inventor has found that the mode-1 natural frequencies of components in the path of vibration generated in the piezoelectric element 314 were preferably less than half the frequency of electrical signals sent to the piezoelectric element 314. For this reason, the vibration transmission member 311 which does not include the mounting portion 301a may be used instead of the vibration transmission member 301. The vibration transmission member 311 may have the same shape and material as the vibration transmission member 301. Moreover, the retention member 315 which does not have a receiving shape may be used instead of the retention member 305. The retention member 315 may have the same shape and material as the retention member 305.

The electrode 312 and the insulating member 313 may be disposed between the second bolt 306 and the piezoelectric element 314. The electrode 312 and the piezoelectric element 314 may be in contact with each other. The electrode 312 and the second bolt 306 may be electrically insulated from each other by the insulating member 313.

The vibration transmission member 311 may function as an electrode of the piezoelectric element 314 which is paired with the electrode 312. In the vibrator unit 310, any member electrically connected to the vibration transmission member 311 may be grounded. FIG. 7 illustrates the case where the vibration transmission member 311 is grounded.

The electrode 312 may be connected to the piezoelectric power supply 112 (see FIG. 2) by a connection line (not illustrated). The frequency of electrical signals sent from the piezoelectric power supply 112 to the electrode 312 may be below the resonance frequency (e.g., 4 MHz) of the piezoelectric element 314.

6.2 Operation

In the vibrator unit 310 illustrated in FIG. 7, as in the vibrator unit 300 illustrated in FIGS. 4 to 6, the vibration generated in the piezoelectric element 314 may be transferred to the target material 271 in the target channel FL via the projection 302 of the vibration transmission member 311, the nozzle holder 265, the nozzle member 266, the tank 260, and other components. Thus, the target material 271 jetted out of the nozzle hole 267 can be cut into droplets in a predetermined size and a predetermined cycle.

The piezoelectric element 314 may receive electrical signals from the piezoelectric power supply 112. As described above, the frequency of the electrical signals may be below the resonance frequency (e.g., 4 MHz) of the piezoelectric element 314. The frequency of the electrical signals may be, for example, 3 MHz. When the frequency of an electrical signal is below the resonance frequency (e.g., 4 MHz) of the piezoelectric element 314, the piezoelectric element 314 can vibrate at a frequency at or below the resonance frequency. This may restrain the generation of vibration noise. Composite piezoelectric elements having a resonance frequency in a range of 3 to 6 MHz may relatively be easily available. For this reason, the frequencies of electrical signals input to the piezoelectric element 314 may be set in a range of 2 to 5 MHz.

In general, vibration can be amplified by the resonance of components when the frequency of the vibration matches the natural frequencies of the components in the vibration transfer path. In order to restrain the amplification of vibration noise caused by the components in the vibration transfer path including the vibration transmission member 311, the frequency of potential vibration noise does not preferably match the natural frequencies of the components.

Figure 8:
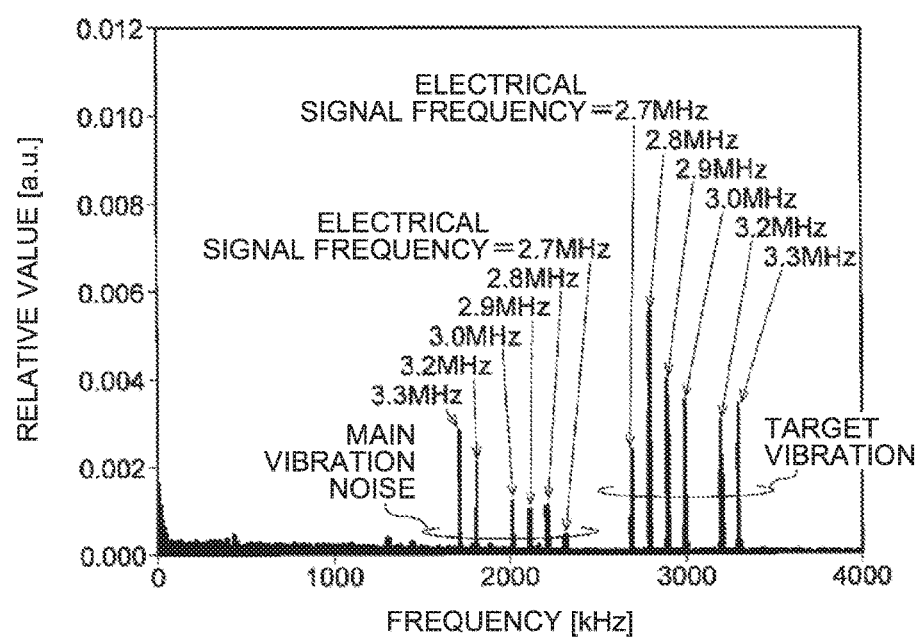
FIG. 8 illustrates the measurements of vibration generated in the nozzle member upon input of an electrical signal to the piezoelectric element in the vibrator unit in FIG. 7.

An experiment by the inventor demonstrated that the frequency of vibration noise that can be generated in the piezoelectric element 314 was lower than the frequencies of electrical signals input to the piezoelectric element 314. FIG. 8 illustrates the measurements of vibration generated in the nozzle member upon input of an electrical signal to the piezoelectric element in the vibrator unit in FIG. 7. In this measurement, a piezoelectric element having a resonance frequency of 400 kHz was used as the piezoelectric element 314. The piezoelectric element 314 received electrical signals with frequencies at or above its resonance frequency. The received frequencies of electrical signals were around 3 MHz. Vibration generated in the nozzle member 266 was measured with a laser Doppler vibrometer. In FIG. 8, the horizontal axis represents the frequency of vibration generated in the nozzle member 266, and the vertical axis represents the relative amplitude of the vibration.

As illustrated in FIG. 8, in the nozzle member 266, vibration directly reflecting the frequencies of electrical signals occurred around 3 MHz which is the range of the frequency of electrical signals. The frequency of the vibration directly reflecting the frequencies of electrical signals may be substantially the same as the frequency of the electrical signal.

In the nozzle member 266, vibration also occurred in a frequency range (around 2 MHz) lower than the range of the frequency of electrical signals. These vibrations may be vibration noise. According to FIG. 8, the inventor found that a lot of vibration noise appeared in a frequency range higher than half the frequencies of the electrical signals.

In general, vibration in a higher-order mode other than the primary mode of the natural frequencies of components has a low amplitude and may easily attenuate. For this reason, components in the vibration transfer path preferably have mode-1 natural frequencies with frequencies that are half the frequencies of the electrical signals or less. For example, the mode-1 natural frequency of the vibration transmission member 311 may have a frequency that is half the frequencies of the electrical signals or less.

The vibration transmission member 311 does not necessarily have the mounting portion 301a. In this case, even if vibration noise occurs in the piezoelectric element 314 or other components, the amplification of the vibration noise caused by the vibration transmission member 311 can be restrained. Similarly, the mode-1 natural frequency of the retention member 315 may have a frequency that is half the frequencies of the electrical signals or less. Here, the retention member 315 does not necessarily have a shape for receiving the insulating member 313.

6.3 Description of Shape of Vibration Transmission Member

Figure 9:
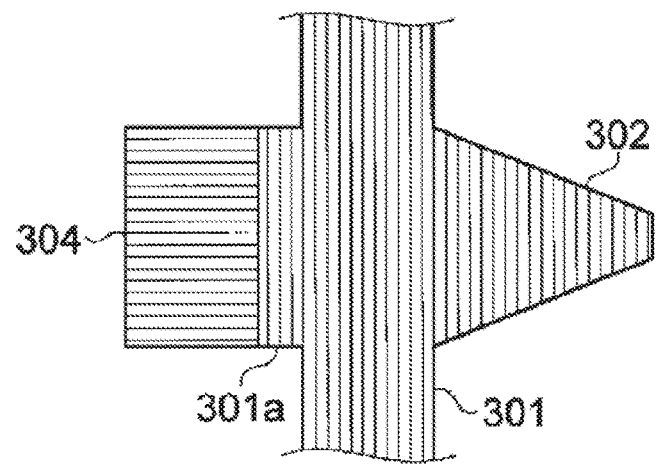
FIG. 9 illustrates a part of a cross sectional shape of a vibration transmission member in a vibrator unit of a comparative example.
Figure 10:
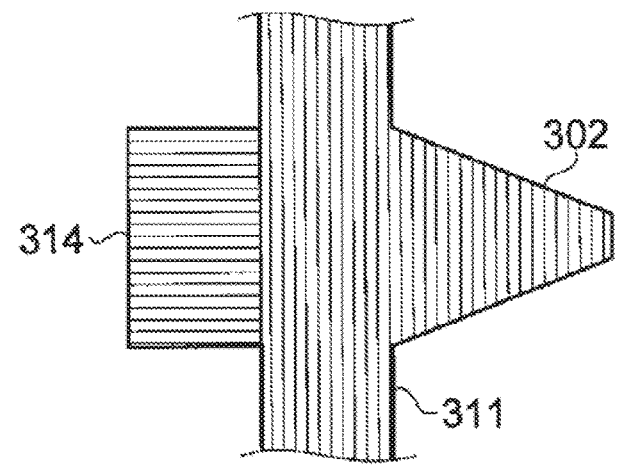
FIG. 10 illustrates a part of a cross sectional shape of a vibration transmission member in the vibrator unit according to Embodiment 1.
Figure 11:
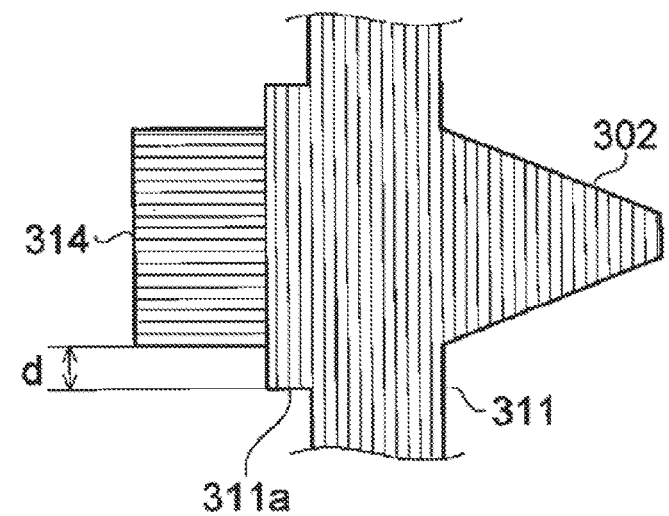
FIG. 11 illustrates a part of a modification of a cross sectional shape of the vibration transmission member in the vibrator unit according to Embodiment 1.

The shape of the vibration transmission member will now be described referring to FIGS. 9 to 11. FIG. 9 illustrates a part of a cross sectional shape of the vibration transmission member 301 in the vibrator unit 300 of a comparative example. FIG. 10 illustrates a part of a cross sectional shape of the vibration transmission member 311 in the vibrator unit 310 according to Embodiment 1. FIG. 11 illustrates a part of a modification of a cross sectional shape of the vibration transmission member 311 in the vibrator unit 310 according to Embodiment 1.

As in the configuration illustrated in FIG. 9, the fixed surface of the piezoelectric element 304 and the facing fixed surface of the mounting portion 301a may have the same shape. In this case, all around corners of the piezoelectric element 304 may be in contact with corners of the mounting portion 301a. When they have such shapes that the corners of the piezoelectric element 304 are in contact with the corners of the mounting portion 301a, resonance may occur between the corners of the piezoelectric element 304 and the corners of the mounting portion 301a. Accordingly, vibration noise may be amplified.

For this reason, as illustrated in FIG. 10, the mounting portion 301a is not necessarily provided in the vibration transmission member 311 according to Embodiment 1. With a configuration in which corners of the piezoelectric element 314 are out of contact with corners of the vibration transmission member 311, the amplification of vibration noise due to resonance between the corners can be restrained.

Note that as illustrated in FIG. 11, the mounting portion 311a that has a mounting surface with an area adequately larger than the area in contact with the piezoelectric element 314 may be provided to the vibration transmission member 311. With this configuration, corners of the piezoelectric element 314 are out of contact with corners of the vibration transmission member 311, thereby restraining the amplification of vibration noise due to resonance between the corners. Here, a distance d between each corner of the piezoelectric element 314 and the corresponding corner of the mounting portion 311a may be determined by the results of vibration analysis. For example, a distance d may be set to 3 mm or more.

If other components to which the vibration of the piezoelectric element 314 can be transferred have a small projection, a level difference, or the like, the small projection, the level difference, or the like may have a natural frequency different from that of the rest of the part. For instance, as for the retention member 305 and other components which have a receiving shape, a concave-convex portion forming the receiving shape may have a natural frequency different from that of the rest of the part. Such a part having a natural frequency different from that of the rest of the part may generate or amplify vibration noise. For this reason, such a part is preferably designed such that small projections, level differences, or the like are reduced as much as possible. For example, the retention member 315 does not necessarily have a receiving shape.

6.4 Effects

Accordingly, the generation and amplification of vibration noise can be restrained by satisfying the following relational expression (1). Consequently, the instability of the droplet generation cycle can be restrained.

Mode-1 natural frequency of components in the vibration transfer path×2≤frequency of electrical signals<resonance frequency of piezoelectric element 314   (1)

The relational expression (1) leads to the relational expression (2).

Mode-1 natural frequency of components in the vibration transfer path×2<resonance frequency of piezoelectric element 314   (2)

As described above, the generation and amplification of vibration noise can be further restrained by a configuration in which corners of components to which vibration can be transferred are out of contact, and a reduction of small concave-convex portions in shapes of components to which vibration can be transferred.

7. VIBRATOR UNIT: EMBODIMENT 2

The vibrator unit according to Embodiment 2 will now be described in detail referring to the drawings.

7.1 Configuration

Figure 12:
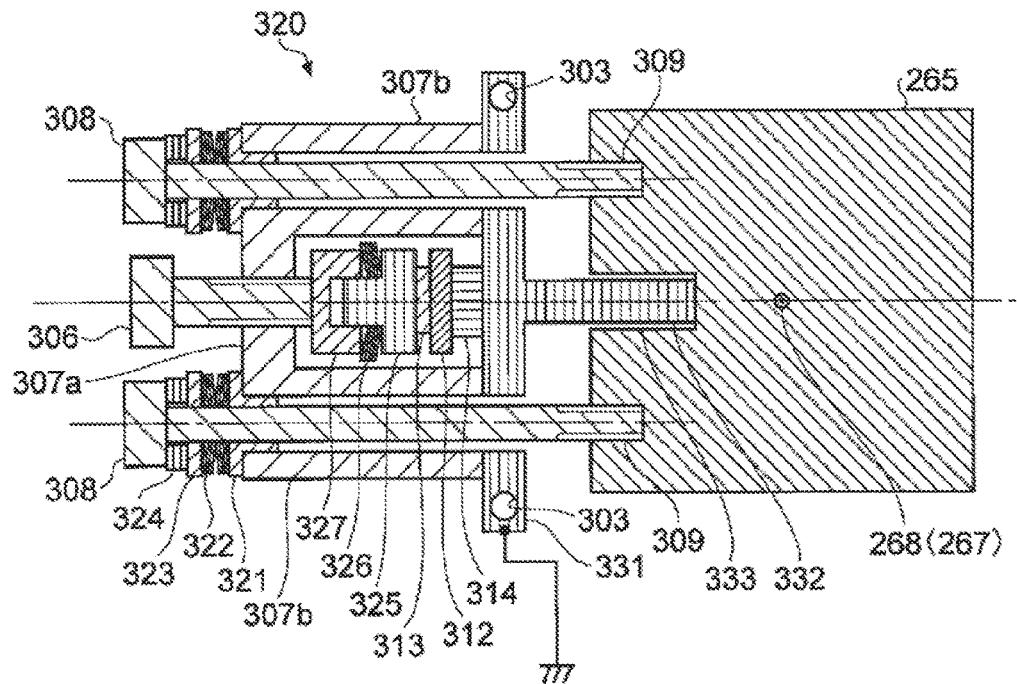
FIG. 12 is a horizontal cross-sectional view of an example of the schematic configuration of the vibrator unit according to Embodiment 2.

FIG. 12 is a cross-sectional view of an example of the schematic configuration of the vibrator unit according to Embodiment 2. It should be noted that FIG. 12 illustrates an example cross-sectional configuration corresponding to FIG. 7. In the description below, the same components as in the vibrator unit 310 are denoted by the same reference numerals as those in the vibrator unit 310 and the overlapping description will be omitted.

Here, the nozzle holder 265, the tank 260, and other components which are in contact with the target material 271 may preferably have low reactivity with the target material 271. Since the selection of materials is limited, the selection of the best material for efficient transfer of vibration cannot always be achieved. To solve this problem, in Embodiment 2, components positioned in the transfer path of the generated vibration to the target material 271 and out of contact with the target material 271 may be composed of a material that has relatively low vibration attenuation rate.

The material that has a relatively low vibration attenuation rate may refer to a material that has a lower vibration attenuation rate than the materials for the components positioned in the transfer path of the generated vibration to the target material 271 and in contact with the target material 271. Examples of the components positioned in the transfer path of the generated vibration to the target material 271 and in contact with the target material 271 may include the nozzle holder 265, the nozzle member 266, and the tank 260. Meanwhile, examples of the components positioned in the transfer path of the generated vibration to the target material 271 and out of contact with the target material 271 may include the vibration transmission member.

For this reason, as illustrated in FIG. 12, the vibrator unit 320 according to Embodiment 2 may have the same configuration as the vibrator unit 310 illustrated in FIG. 7 except that it has the vibration transmission member 331 instead of the vibration transmission member 311.

The vibration transmission member 331 may have the same configuration as the vibration transmission member 311 except that it has a vibrator pin 332 instead of the projection 302. The vibrator pin 332 may be integrated with or independent of the other components of the vibration transmission member 331.

The vibrator pin 332 may be a circular cylinder. A cross section of the circular cylinder of the vibrator pin 332 may be smaller than the area of any one surface of the piezoelectric element 314.

The vibrator pin 332 may be composed of a material that has a lower vibration attenuation rate than the materials for the nozzle holder 265, the tank 260, and other components. When the nozzle holder 265, the tank 260, and other components are composed of molybdenum, their log vibration attenuation rate may be 0.03. In this case, the vibrator pin 332 may be composed of, for example, stainless steel or the like having a log vibration attenuation rate of 0.01 (<0.03). The other components of the vibration transmission member 331 may also be composed of a material that has a lower vibration attenuation rate than the materials for the nozzle holder 265, the tank 260, and other components.

A portion of the nozzle holder 265 which is in contact with the vibration transmission member 331 may be provided with a vibrator hole 333. The tip of the vibrator pin 332 may be in contact with the bottom of the vibrator hole 333. The vibrator hole 333 may be a depression extending from the side surface of the nozzle holder 265 toward the target channel FL. To be specific, the vibrator hole 333 may have a shape that makes the position of a contact portion between the vibrator pin 332 and the nozzle holder 265 close to the target channel FL. The minimum distance between the interface (i.e., the bottom of the vibrator hole 333) and the target channel FL may be, for example, 2 to 5 mm. More preferably, the minimum distance may be 3 mm.

The aperture shape of the vibrator hole 333 is not necessarily circular and may be a triangle, a quadrangle, or other various shapes. The vibrator hole 333 may be a groove formed in one side surface of the nozzle holder 265.

Like the vibrator unit 300, the position in which the vibrator unit 310 is mounted is not limited to the side surface of the nozzle holder 265. For example, the vibrator unit 310 may be mounted on the side surface of the tank 260. That is, the vibrator unit 310 may be mounted in any position where it can apply vibration to the target material 271 present in the target channel FL.

In the configuration illustrated in FIGS. 4 to 6, when the tank 260, the nozzle holder 265, and other components are heated to eject the target 27, the heat may also increase the temperature of the first bolt 308 of the vibrator unit 300. Consequently, the first bolt 308 may be at almost the same temperature as the tank 260 and other components. Meanwhile, the vibration transmission member 301 may be cooled by cooling water flowing through the cooling water piping 303, resulting in a temperature difference of several tens of degrees.

With this configuration in which such a big temperature difference may occur, if the vibrator unit 300 which has been assembled at room temperature is heated with the nozzle holder 265, the tank 260, and other components mounted thereon, the first bolt 308 is expanded by heat in the extending direction and the interface pressure between the components may therefore decrease. Moreover, the pressure pushing the vibration transmission member 301 against the nozzle holder 265, the tank 260, and other components and the pressure pinching the piezoelectric element 304 may decrease or fluctuate.

To be specific, the first bolt 308 with an increasing temperature may thermally expand in the extending direction, while the thermal expansion of the cooled vibration transmission member 301 and pressure frame 307 may be restrained. This may reduce the pressure from the first bolt 308 pushing the pressure frame 307 and the vibration transmission member 301 against the nozzle holder 265, the tank 260, and other components. This may reduce the pressure from the pressure frame 307 to the vibration transmission member 301. Similarly, the pressure from the second bolt 306 to the vibration transmission member 301 via the retention member 305 and the piezoelectric element 304 may be reduced. Further, the pressure pinching the piezoelectric element 304 with the retention member 305 and the vibration transmission member 301 may be reduced. These factors may reduce the vibration transfer efficiency during the transfer of the vibration generated in the piezoelectric element 304 to the target material 271.

Such looseness due to thermal expansion can be removed by adjusting the screw torque of the first bolt 308 and the second bolt 306. However, there may be variations in the precision of a torque wrench or other tools for turning the bolts, friction between the screw and the screw hole, and other factors. Therefore, the pressure from the first bolt 308 to the vibration transmission member 301 and the pressure from the second bolt 306 to the vibration transmission member 301 and the piezoelectric element 304 may vary between individual vibrator units 300. Consequently, the efficiency of transfer of vibration generated in the piezoelectric element 304 may vary between individual vibrator units 300.

To solve this problem, as illustrated in FIG. 12, the vibrator unit 320 according to Embodiment 2 may have the same configuration as the vibrator unit 310 except that it further includes first and second elastic sections 322 and 326, first and second seats 321 and 327, washers 323, and shims 324. In addition, the retention member 315 in the vibrator unit 310 may be replaced by the retention member 325.

The first elastic section 322 may be disposed between the head of the first bolt 308 and the pressure frame 307. The first seat 321 may be disposed between the elastic section 322 and the pressure frame 307. Meanwhile, the washer 323 and one or more shims 324 may be disposed between the elastic section 322 and the head of the first bolt 308.

The second seat 327 may be disposed at the end of the shaft of the second bolt 306. The second seat 327 and the retention member 325 may have a projection and a depression, respectively, to engage with each other. The second elastic section 326 may be disposed between the second seat 327 and the retention member 325.

The first elastic section 322 may be a ring-shaped member through which the shaft of the first bolt 308 can be inserted. Similarly, the second elastic section 326 may be a ring-shaped member through which the projection of the second seat 327 or the retention member 325 can be inserted. These first and second elastic sections 322 and 326 may be, for example, disc springs. The first seat 321 and the second seat 327 may hold the first elastic section 322 and the second elastic section 326, respectively, in such a way that they are deformable.

Like the vibrator unit 310, the position in which the vibrator unit 320 is mounted is not limited to the side surface of the nozzle holder 265. For example, the vibrator unit 320 may be mounted on the side surface of the tank 260. That is, the vibrator unit 320 may be mounted in any position where it can apply vibration to the target material 271 present in the target channel FL.

7.2 Operation

In the vibrator unit 320 illustrated in FIG. 12, as in the vibrator unit 310 illustrated in FIG. 7, the vibration generated in the piezoelectric element 314 may be transferred to the target material 271 in the target channel FL via the vibrator pin 332 of the vibration transmission member 331, the nozzle holder 265, the nozzle member 266, the tank 260, and other components. Thus, the target material 271 jetted out of the nozzle hole 267 can be cut into droplets in a predetermined size and a predetermined cycle.

In the vibrator unit 320 illustrated in FIG. 12, a fluctuation (e.g., a reduction in pressure) due to a difference in thermal expansion between components caused by pressure across the vibration transmission member 331 may be reduced by the elastic three and stroke of the first elastic section 322.

Besides, a fluctuation in pressure (e.g., a reduction in pressure) to the central portion of the vibration transmission member 331 (i.e., the vibrator pin 332) may be reduced by the elastic force and stroke of the first and second elastic sections 322 and 326.

Moreover, a fluctuation in pressure to the piezoelectric element 314 may be reduced by the elastic force and stroke of the first and second elastic sections 322 and 326.

When the first elastic section 322 and the second elastic section 326 are disc springs, the elastic force and stroke of each elastic section may be adjusted by adjusting the number of disc springs, the direction in which the disc springs are stacked, the hardness of the disc springs, and the like.

Loads (preloads) preliminarily applied to the first elastic section 322 and the second elastic section 326 may be adjusted by adjusting the screw torques of the first bolt 308 and the second bolt 306. When the shim 324 is disposed between the first bolt 308 and the first elastic section 322, the preload on and the stroke of the first elastic section 322 may be adjusted by adjusting the thickness and the number of shims 324.

A pressure to the vibration transmission member 331 (vibrator pin 332) and a pressure to the piezoelectric element 314 may be adjusted so that the surface pressure between the vibrator pin 332 and the nozzle holder 265, for example, can be higher than the surface pressure between the piezoelectric element 314 and the vibration transmission member 331. In this case, the surface pressure between the piezoelectric element 314 and the vibration transmission member 331 may be adjusted to about 30 MPa, for example.

7.3 Effects

As described above, in the vibrator unit 320 according to Embodiment 2, the vibration transmission member 331 in the transfer path of the generated vibration to the target material 271 may be composed of a material having a vibration attenuation rate lower than those of the nozzle holder 265, the tank 260, and other components. This may allow the vibration generated in the piezoelectric element 314 to be efficiently transferred to the target material 271 in the target channel FL.

Since the vibrator hole 333 brings the interface between the vibrator pin 332 and the nozzle holder 265 close to the target channel FL, a section, which has a higher vibration attenuation rate than the vibration transmission member 331, of the vibration transfer path extending from the piezoelectric element 314 to the target material 271 can be shortened. This may allow the vibration to be more efficiently transferred to the target material 271.

When the vibrator pin 332 is integrated with the other components of the vibration transmission member 331, the number of components in the vibration transfer path can be reduced, thereby reducing vibration attenuation that occurs at the joints between the components. This may allow the vibration to be more efficiently transferred to the target material 271.

Accordingly, even with a small nozzle diameter, high-frequency vibration with an adequate amplitude can be transferred to the target material 271. This may enable stable generation of droplets.

In the vibrator unit 320 according to Embodiment 2, when the target 27 to be ejected is heated by the heater 141, fluctuations in pressure to the vibration transmission member 331 (the vibrator pin 332) and pressure to the piezoelectric element 314 may be restrained.

The first and second elastic sections 322 and 326, the shim 324, and other components can deform (stroke), which may dramatically increase the degree of flexibility in the adjustment of the pressure to the vibration transmission member 331 (the vibrator pin 332) and the pressure to the piezoelectric element 314. This may enable accurate adjustment of the pressure to the vibration transmission member 331 (the vibrator pin 332) and the pressure to the piezoelectric element 314. This may result in a reduction in a difference between individual vibrator units 300 in transfer efficiency of vibration generated in the piezoelectric element 304.

It should be noted that the components of the vibrator unit 320 (especially the first bolt 308 and the second bolt 306) may be composed of a material with a relatively low coefficient of thermal expansion. The material with a relatively low coefficient of thermal expansion may be, for example, an alloy having Invar or nickel as the main component.

In addition, the first bolt 308 and the second bolt 306 may be composed of a material with a relatively low thermal conductivity. The material with a relatively low thermal conductivity may be a ceramic, such as aluminum nitride, silicon carbide, or boron nitride.

It should be noted that the other configurations, operations, and effects may be the same as those in the above-described embodiment.

8. VIBRATOR UNIT: EMBODIMENT 3

As mentioned above, a contact between components to which the vibration generated in the piezoelectric element 314 can be transferred induces a resonance between these components and may therefore be a cause of the amplification of vibration noise.

In view of this, Embodiment 3 illustrates the case where the number of components to which the vibration generated in the piezoelectric element 314 can be transferred is reduced. Although Embodiment 3 illustrates a configuration based on the vibrator unit 320 illustrated in FIG. 12, it may be based on any of the other embodiments illustrated in the present disclosure.

8.1 Configuration

Figure 13:
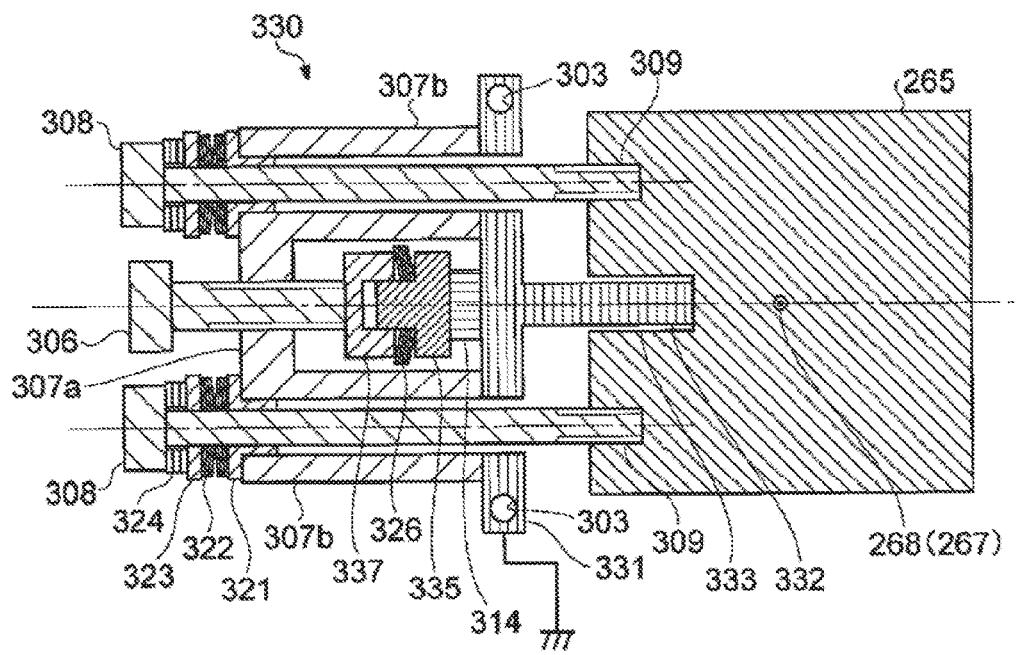
FIG. 13 is a horizontal cross-sectional view of an example of the schematic configuration of the vibrator unit according to Embodiment 3.

FIG. 13 is a cross-sectional view of an example of the schematic configuration of the vibrator unit according to Embodiment 3. It should be noted that FIG. 13 illustrates an example cross-sectional configuration corresponding to FIG. 12. In the description below, the same components as in the vibrator unit 320 are denoted by the same reference numerals as those in the vibrator unit 320 and the overlapping description will be omitted.

As illustrated in FIG. 13, a vibrator unit 330 according to Embodiment 3 may have the same configuration as the vibrator unit 320 illustrated in FIG. 12 except that it includes an electrode 335 instead of the electrode 312, the insulating member 313, and the retention member 325, and a second seat 337 instead of the second seat 327.

The electrode 335 may have the same shape and function as the retention member 325. Like the electrode 312, the electrode 335 is paired with the vibration transmission member 331 and may be connected to the piezoelectric power supply 112 (see FIG. 2) by a connection line (not illustrated).

The second seat 337 may have the same shape and function as the second seat 327. Like the insulating member 313, the second seat 337 may electrically insulate the electrode 335 from the second bolt 306.

8.2 Effects

Such a configuration can reduce the number of components to which the vibration generated in the piezoelectric element 314 can be transferred. This restrains the induction of a resonance between the components, resulting in less amplification of vibration noise.

It should be noted that the other configurations, operations, and effects may be the same as those in the above-described embodiment.

The above description should not be construed to be restrictive but illustrative only. Accordingly, it should be understood by those skilled in the art that modifications of the embodiments of the present disclosure can be made without departing from the attached claims.

The terms used throughout the description and the attached claims should be construed to be "non-restrictive". For example, the term such as "include" or "included" should be construed to mean "include, but should not be limited to". The term "have" should be construed to mean "have, but should not be limited to". The indefinite article "a" in the description and attached claims should be construed to mean "at least one" or "one or more".

What is claimed is:

1. A vibrator configured to vibrate a target material in a target channel, comprising:
    a vibration element configured to vibrate in response to an external electrical signal having a predetermined frequency, a resonance frequency of the vibration element being different from the predetermined frequency of the electrical signal;
    a vibration transmission member configured to be in contact with the vibration element and a first member including the target channel in the interior and transfer vibration of the vibration element to the first member;
    a second elastic section configured to apply pressure pushing the vibration element against the vibration transmission member; and
    a second adjuster configured to adjust the pressure from the second elastic section to the vibration element.

2. The vibrator unit according to claim 1, wherein the resonance frequency of the vibration element is higher than the predetermined frequency.

3. The vibrator unit according to claim 1, wherein the vibration element includes one of a composite piezoelectric element and a bulk piezoelectric element.

4. The vibrator unit according to claim 1, further comprising:
a frame member;
a first elastic section configured to apply pressure pushing the frame member against the vibration transmission member; and
a first adjuster configured to adjust pressure from the first elastic section to the frame member and fix the frame member and the vibration transmission member to the first member.

5. The vibrator unit according to claim 4, wherein
the vibration transmission member includes a vibrator pin in contact with the first member,
a recess formed such that a portion of the first member in contact with the vibration element is close to the target channel is provided in the portion, and
at least a tip of the vibrator pin is disposed in the recess.

6. The vibrator unit according to claim 5, wherein the vibration transmission member has a refrigerant path through which a refrigerant flows.

7. A vibrator unit configured to vibrate a target material in a target channel, comprising:
a vibration element configured to vibrate in response to an external electrical signal having a predetermined frequency, a resonance frequency of the vibration element being different from the predetermined frequency of the electrical signal; and
a vibration transmission member configured to be in contact with a first member including the target channel in the interior, wherein
the vibration element is configured to be in contact with the vibration transmission member,
and
a mode-1 natural frequency of the vibration transmission member is different from the resonance frequency of the vibration element.

8. The vibrator unit according to claim 7, wherein the mode-1 natural frequency of the vibration transmission member is lower than the resonance frequency.

9. The vibrator unit according to claim 7, wherein the resonance frequency of the vibration element is higher than the predetermined frequency.

10. The vibrator unit according to claim 7, wherein the mode-1 natural frequency of the vibration transmission member is half the predetermined frequency of the electrical signal or less.

11. The vibrator unit according to claim 7, wherein the vibration element includes one of a composite piezoelectric element and a bulk piezoelectric element.

12. The vibrator unit according to claim 7, wherein an outer edge of a surface of the vibration transmission member in contact with the vibration element is a predetermined distance away from an outer edge of a surface of the vibration element in contact with the vibration transmission member.

13. The vibrator unit according to claim 7, further comprising an electrode configured to be in contact with the vibration element such that the electrode and the vibration transmission member pinch the vibration element, wherein
an outer edge of a surface of the electrode in contact with the vibration element is a predetermined distance away from an outer edge of a surface of the vibration element in contact with the electrode.

14. The vibrator unit according to claim 13, wherein the vibration transmission member is grounded.

15. A target supply device that ejects a target material, comprising:
a first member including a target channel in the interior; and
the vibrator unit according to claim 7, wherein
the resonance frequency of the vibration element is higher than the predetermined frequency of the electrical signal, and
the mode-1 natural frequency of the vibration transmission member is half the predetermined frequency or lower.

16. The target supply device according to claim 15, further comprising:
a second elastic section configured to apply pressure pushing the vibration element against the vibration transmission member;
a second adjuster configured to adjust pressure from the second elastic section to the vibration element.

17. The target supply device according to claim 16, further comprising:
a frame member;
a first elastic section configured to apply pressure pushing the frame member against the vibration transmission member; and
a first adjuster configured to adjust pressure from the first elastic section to the frame member and fix the frame member and the vibration transmission member to the first member.

18. The target supply device according to claim 17, wherein
the vibration transmission member includes a vibrator pin in contact with the first member,
a recess formed such that a portion of the first member in contact with the vibration element is close to the target channel is provided in the portion, and
at least a tip of the vibrator pin is disposed in the recess.

19. The target supply device according to claim 18, wherein the vibration transmission member has a refrigerant path through which a refrigerant flows.

20. The vibrator unit according to claim 7, wherein the resonance frequency of the vibration element is higher than the predetermined frequency.

21. The vibrator unit according to claim 7, wherein the vibration element includes one of a composite piezoelectric element and a bulk piezoelectric element.

* * * * *